United States Patent

Lubert et al.

(10) Patent No.: US 6,618,940 B2
(45) Date of Patent: Sep. 16, 2003

(54) FINE PITCH CIRCUITIZATION WITH FILLED PLATED THROUGH HOLES

(75) Inventors: Kenneth J. Lubert, Endicott, NY (US); Curtis L. Miller, Vestal, NY (US); Thomas R. Miller, Endwell, NY (US); Robert D. Sebesta, Endicott, NY (US); James W. Wilson, Vestal, NY (US); Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/909,211

(22) Filed: Jul. 19, 2001

(65) Prior Publication Data

US 2001/0050183 A1 Dec. 13, 2001

Related U.S. Application Data

(62) Division of application No. 09/345,573, filed on Jun. 30, 1999, now Pat. No. 6,291,779.

(51) Int. Cl.[7] .................................................. H05K 3/10
(52) U.S. Cl. ............................ 29/846; 29/847; 29/852; 174/265; 174/266; 216/19; 216/38; 216/41; 427/97; 427/123; 430/314; 430/318
(58) Field of Search ........................ 29/831, 846, 847, 29/852; 427/76, 97, 123, 126.3; 216/13, 41, 49, 91, 92, 100, 105, 19, 88, 38, 52; 430/314, 313, 318, 319; 205/125; 174/262, 264, 265, 266; 264/792, 793, 795

(56) References Cited

U.S. PATENT DOCUMENTS

| 4,383,363 | A | * | 5/1983 | Hayakawa et al. | 29/847 |
| 5,220,135 | A | * | 6/1993 | Kawakami et al. | 174/264 |
| 5,243,142 | A | * | 9/1993 | Ishikawa et al. | 174/262 |
| 5,557,844 | A | * | 9/1996 | Bhatt et al. | 29/852 |
| 5,985,521 | A | * | 11/1999 | Hirano et al. | 216/18 |
| 6,272,745 | B1 | * | 8/2001 | Kersten et al. | 29/852 |
| 6,467,160 | B1 | * | 10/2002 | Cummings et al. | 29/831 |

* cited by examiner

Primary Examiner—Peter Vo
Assistant Examiner—Donghai Nguyen
(74) Attorney, Agent, or Firm—Salzman & Levy; Laurence R. Fraley

(57) ABSTRACT

A high density printed wiring board is prepared by applying an essentially solid material into plated through holes such that the metallized layers within the through hole are unaffected by chemical metal etchants. In this manner, lateral surface metallized layers can exclusively be reduced in thickness by use of said chemical agents. These thinned lateral surface metallized layers are ultimately converted into fine pitch, 25 to 40 microns, circuitry, thereby providing high density boards. Since the through hole wall metallization is unaffected by the etching process, excellent electrical connection between the fine line circuitry is obtained. Various printed wiring board embodiments are also presented.

13 Claims, 11 Drawing Sheets

FINE PITCH CIRCUITIZATION WITH FILLED PLATED THROUGH HOLES

This application is a divisional of application Ser. No. 09/345,573, filed on Jun. 30, 1999, now U.S. Pat. No. 6,291,779.

FIELD OF THE INVENTION

This invention relates to a high performance printed wiring board structure having very high circuitry density per unit of area, and to a method of fabrication and utilization of such a printed wiring board structure.

BACKGROUND OF THE INVENTION

With the recent strong trend toward reduced sizes in electronic components and the resulting high density requirements for electronic packaging such as printed wiring board structures, there have been increased demands to design a process that will generate high quality, high density printed wiring boards efficiently.

In the past decade the density per unit area of electronic devices, such as very large scale integrated circuits (VLSIs), has greatly increased. By some estimates this increase in density has been on the order of 10,000 times what it was in the earliest days of the technology. The space or area available outside of a VLSI in which to make the large number of necessary connections to and from it and to provide the necessary circuitry is becoming almost vanishingly small measured by previous standards. Contrary to the density increase of VLSIs, the density of the passive circuits on printed wiring boards has increased (i.e., the parts have decreased in size) by only a relatively small factor: less than about 4 to 1. This presents the difficult problem of providing circuitry on the printed wiring board to the VLSIs which is small enough to fit the spaces available and which is also sufficiently reliable and manufacturable to be economically useful.

Perhaps one of the most significant limitations on creating high density fine line circuitry on printed wiring boards is the generally known problem of anisotropic etching. It is known that etching metals, especially copper metal, is not an anisotropic process. That is, vertical etching is not feasible without some amount of unwanted horizontal etching. This creates a situation in which the features and circuitry so formed can be severely undercut, leading to different types of failures and reject material. The problem is exacerbated by having thick metal layers. However, this is precisely the situation that is created when standard vias or through holes are part of the manufacturing process.

It is well known that the plating within a through hole is thinner than the plating on the external surfaces; yet a minimum thickness in the through hole is required in order to provide an adequate and reliable electrical connection between circuitry on the opposing surfaces or at various levels within the printed wiring board. Therefore, the general practice is to plate excess material on the lateral faces in order to ensure sufficient plating of the through holes. The effect of this is that the greater than necessary thickness of the lateral surface plating then causes greater amounts of undercutting during the circuitization/etching process. To compensate for this effect, the circuitry lines are designed wider and farther apart than otherwise required or desired. To resolve this problem, thinning down the lateral surface by etching, prior to circuitization, has been attempted. If chemically performed, this process also undesirably etches within the plated through hole. Mechanical etching of the lateral surface plating is possible, but general practice for a process of this type is very slow.

Hayakawa et al. in U.S. Pat. No. 4,383,363, teach the use of conductive materials for filling through holes but no mention is made of non-conductive materials for this application. Hayakawa et al. do not disclose the significance of a thin metallic layer for creating high density circuitry. The purpose of the conductive filling in their invention is solely to electrically connect the two major faces of the substrate, not to protect the metallized layer in the through hole, as in the present invention.

Kawakami et al. in U.S. Pat. No. 5,220,135, disclose a conductive filling within the through hole of an insulative substrate. As in U.S. Pat. No. 4,383,363, supra, no mention is made of protecting the metallized layer within the plated through hole.

Bhatt et al. in U.S. Pat. Nos. 5,557,844 and 5,487,218, disclose a process and a material for forming filled through holes and blind holes. The filler material is an organic polymeric material optionally with a particulate filler. The filler composition is compounded to have a coefficient of thermal expansion matching the coefficient of thermal expansion of the dielectric substrate. The fill material may be either conductive or non-conductive. These patents teach first laminating a copper foil to a dielectric substrate followed by thinning the foil to an acceptable thickness, then drilling through holes and subsequently electroless plating into the through holes to create a conductive layer therein. The filling in the '844 patent occurs after the etching process of the lateral metallized layers, unlike the present invention which requires that the filler be present during the etching process. Furthermore, the specific benefit of the present invention is that both the lateral metallic layers and the through hole metallized layer are applied simultaneously, unlike the '844 disclosure which specifies that these steps occur sequentially.

Having discussed the general problem and the current attempts at the problem, it is understood that various improvements would be beneficial.

Therefore, it is an object of the current invention to provide a high density (low pitch) fine line circuitry printed wiring board structure.

It is another object of the invention to provide thin surface layer circuitry.

It is another object of the invention to protect the plating within plated through holes.

It is yet another object of the invention to provide a high density (low pitch) fine line circuitry printed wiring board having multiple layers of circuitry interconnected through plated through holes or blind holes.

Yet another object if this invention is to provide a method of making a circuitized substrate capable of being used as a chip carrier assembly. The method can be performed in a facile and relatively inexpensive manner in comparison to existing carrier manufacturing processes.

It is still another object of the invention to provide circuitry and features that have a smaller height than via plating thickness in order to maximize interlayer reliability and to minimize pitch distance for surface features.

It is a more particular object of the invention to provide such a process which is readily adaptable to existing manufacturing equipment without extensive modification thereof.

SUMMARY OF THE INVENTION

In accordance with one aspect of this invention, there is defined a method of making a circuitized substrate, the method comprising the steps of providing an electrically insulative base member (dielectric substrate) having first and second lateral surfaces, forming at least one via hole, applying a first electrically conductive layer onto the first and second surfaces of the base member, including at least one sidewall of the via, filling the via with a non-conductive material, planarizing at least one of the first and second surfaces, thinning the first conductive layer on the first and second surfaces, and performing a second planarization of the thinned first electrically conductive layer. The method still further includes applying a photoimaging material onto the thinned first conductive layer then exposing and developing selected portions of the photoimaging material to define a pattern within the photoimaging material on the thinned first conductive layer. The method further includes circuitizing the thinned first conductive layer and then removing the photoimaging material from the thinned first conductive layer. The fill material contained in the plated vias is not removed during this or later processes.

The inventive method involves protecting the metallized layer within a via such as a through hole or blind hole from being chemically etched during later manufacturing steps. In order to protect this metallized layer, a filling material is injected into the hollow region of the plated through hole to essentially prevent chemical etchants from contacting and attacking its surface. Ideally, the material should substantially fill the plated through hole. If additional filling is inadvertently applied, a planarization process can be performed to achieve coplanarity between the outer surface of the filling material and the outer surface of the lateral metallized layer.

When the filling material is coplanar it can be used as an area to additionally support the application of liquid or dry film photoresists. These photoresists are necessary to personalize or circuitize the lateral metallized or conductive layers. The photoresist should make intimate contact with the lateral surface. Having a filled through hole assists in achieving that goal. The filled through hole allows the use of liquid photoresists that ordinarily would not be capable of being used with standard open ended plated through holes unless other steps are performed.

One benefit of the present invention is the ability to produce higher density circuitry than is currently available from existing designs. This invention can produce circuitry having a cross-section width of 0.7–2.0 mil and spacing between the circuitry of 0.5–2.0 mil. No other photolithographic processes are known to the inventors that can generate these same dimensions.

Other benefits and further scope of applicability of the present invention will become apparent from the detailed description given hereinbelow. It should be understood, however, that the detailed description and specific examples, while indicating preferred embodiments of the invention, are given by way of illustration only, since various changes and modifications within the scope and spirit of the invention will become apparent to those skilled in the art from this detailed description.

BRIEF DESCRIPTIONS OF THE DRAWINGS

A complete understanding of the present invention may be obtained by reference to the accompanying drawings, when considered in conjunction with the subsequent detailed description, in which.

Figure 9:
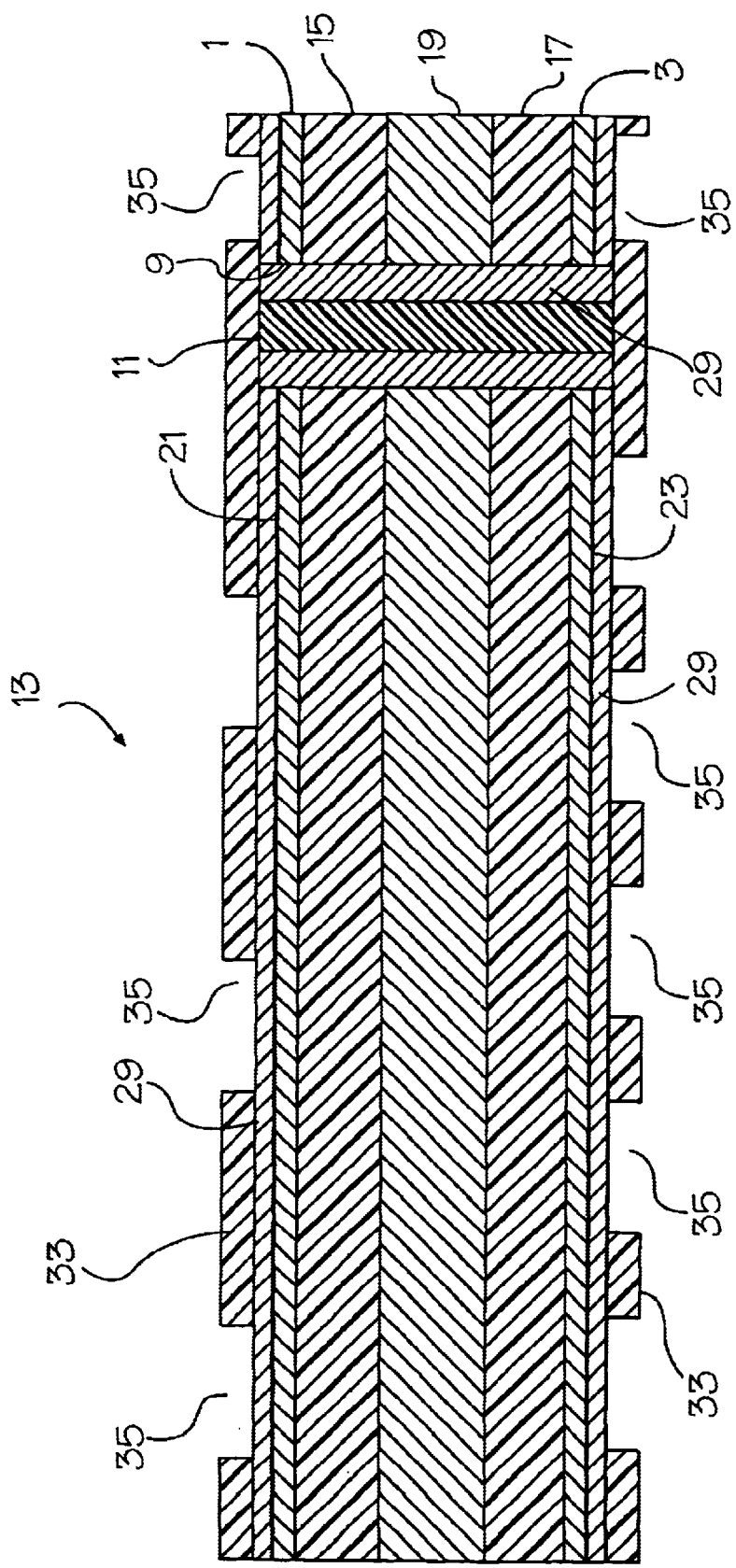
FIG. 9 is an intermediary cross-section view of a printed wiring board as in FIG. 8, wherein the photoresist has been imaged and developed to create discontinuities uncovering portions of the external metallized layer.
Figure 10:
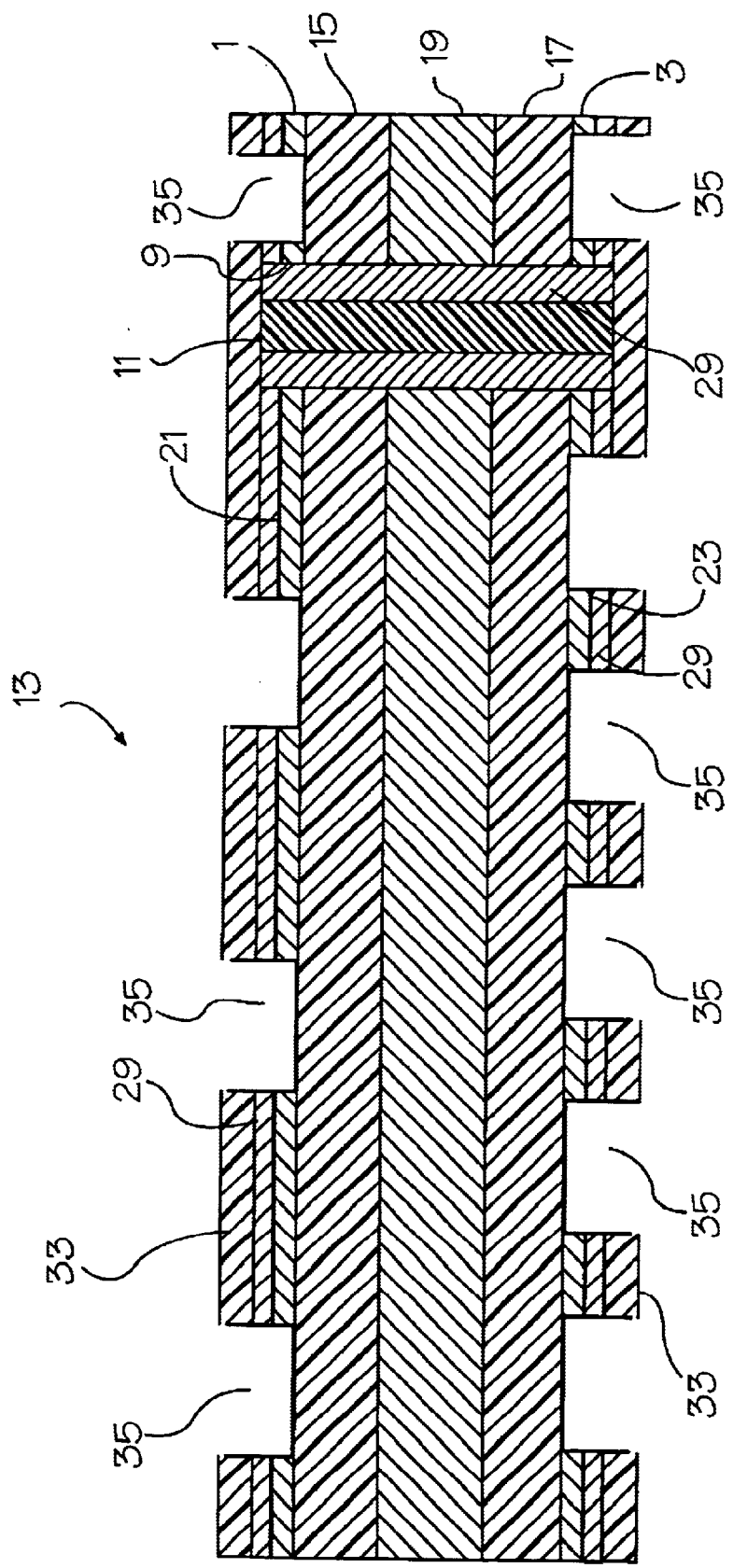
Figure 11:
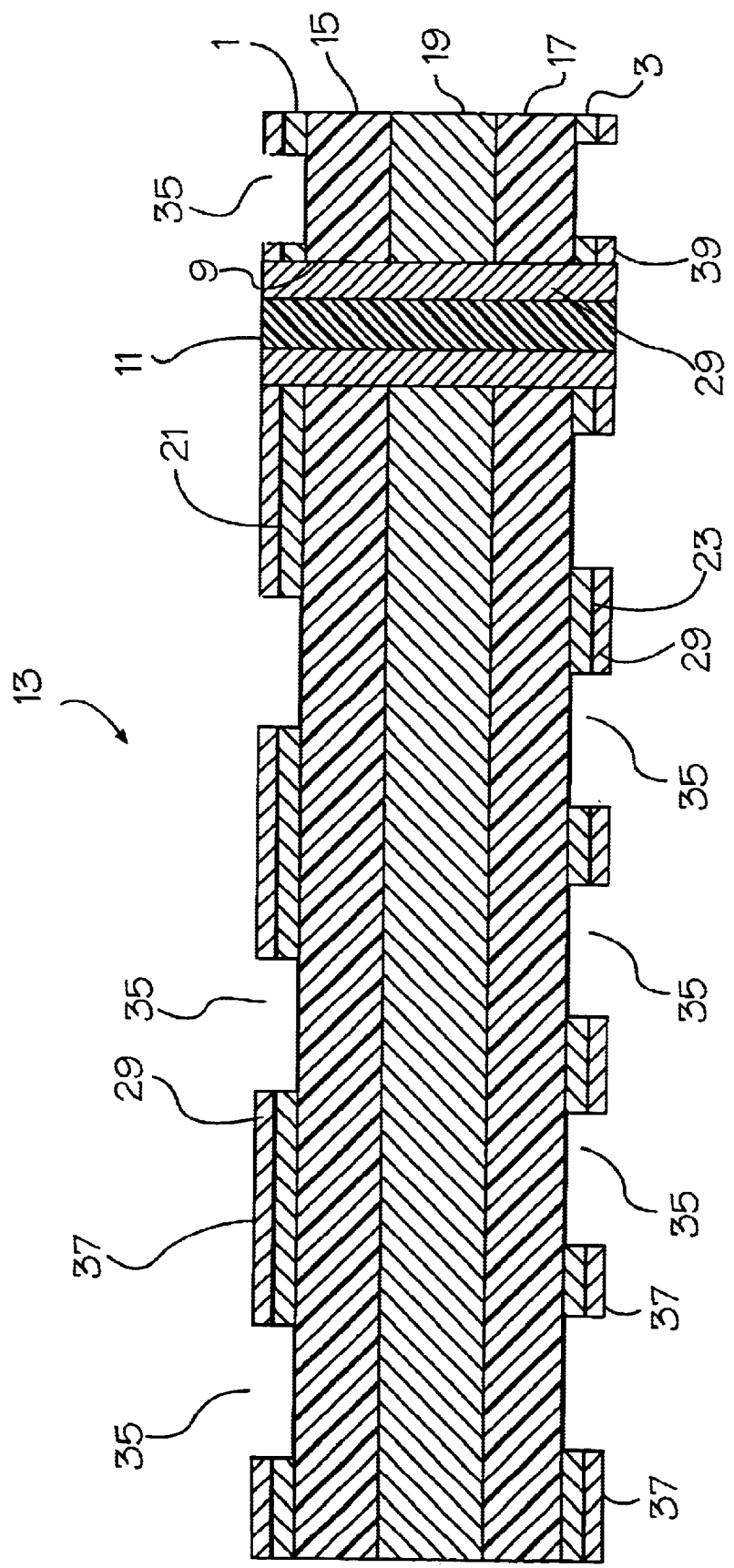

FIG. 10 is an intermediary cross-section view of a printed wiring board as in FIG. 9, wherein the uncovered portions of the external metallized layer are etched, to generate features and circuitry on the dielectric substrate; and FIG. 11 is an intermediary cross-sectional view of a printed wiring board as in FIG. 10, wherein the remaining photoresist is stripped, creating unique metallized features and circuitry corresponding to one embodiment of the invention.

DETAILED DESCRIPTION OF THE PREFERRED EMBODIMENT

As briefly described in the Summary and depicted in the drawings, the present invention provides a printed wiring board that has incorporated as part of its features a filled plated through and a method of manufacturing an article containing such a feature.

For a better understanding of the present invention, together with other and further objects, advantages and capabilities thereof, reference is made to the following disclosure and appended claims in connection with the above-described drawings.

The invention defines a method of making a circuitized substrate (and the resulting chip carrier) in which the chip carrier is particularly designed to accommodate wire bond-type chips. The carrier produced in accordance with the teachings herein is capable of:

1) exhibiting relatively high electrical signal propagation speeds;
2) accommodating relatively high I/O chips;
3) avoiding the need for multiple manufacturing setup operations heretofore associated with multi-tiered wire bond packages, as well as achieving a relatively short "time of flight" for electrical signals propagating through the wire bonds; and 4) assuring a relatively high rate of heat dissipation.

In particular, the chip carrier produced in accordance with the preferred method taught herein achieves relatively high electrical propagation speeds because it employs organic materials, such as fiberglass-reinforced epoxy resins (in the trade also referred to as FR4), polytetrafluoroethylene (e.g., TEFLON®), etc. in lieu of ceramic materials. (TEFLON is a trademark of E. I. duPont deNemours.) The resulting chip carrier also accommodates relatively high I/O count chips because it uses fine pitch, fan-out circuitry. The resulting chip carrier achieves a relatively short "time of flight" for electrical signals propagating through the wire bonds. The invention may further provide enhanced heat sinking for such a structure through the attachment of a solid heat conductor (e.g., copper sheet) to one side of the substrate and placement of the chip (or chips) in thermal contact therewith.

Figure 1:
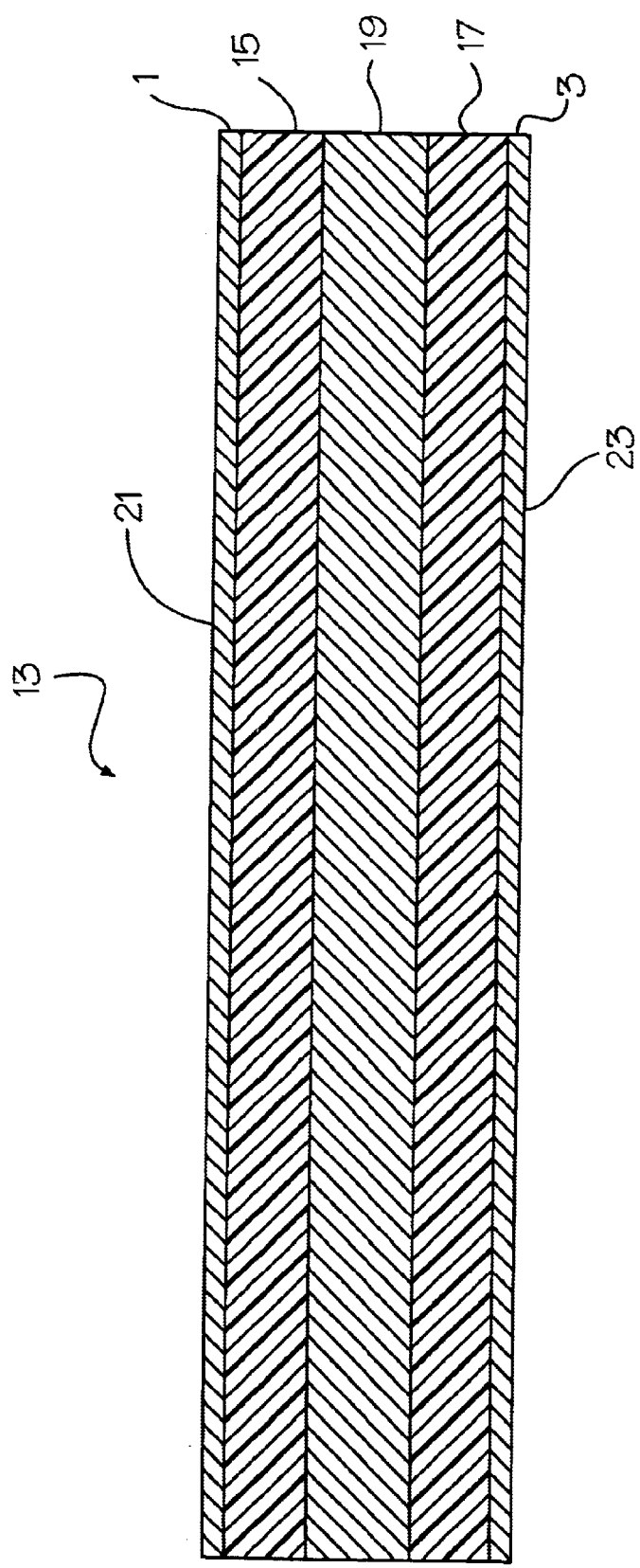
FIG. 1 is an intermediary cross-section view of a printed wiring board comprising a dielectric substrate or base member having an inner (embedded) conductive layer and two external conductive layers on opposing lateral faces of the base member, all isolated from each other.

In FIG. 1, there is shown an electrically insulative base member 13 which may be used in the present invention to produce a chip carrier product, described below. It is understood that the invention is not limited to the particular configuration shown in FIG. 1, as others are readily possible. Base member 13 includes first and second conductive layers 1 and 3, which sandwich therebetween first and second dielectric layers 15 and 17 and a conductive plane 19. In a preferred embodiment, each of the two conductive layers comprises copper or a well known conductive material, each having a thickness from about 0.25 mils (0.00025 inches) to about 1.5 mils with the thickness of each preferably being about 0.25 mils. Each of the two dielectric layers comprises fiberglass reinforced epoxy resin (FR4) and each possesses a thickness of from about 2 mils to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, may also prevent optimum package electrical performance.

Sandwiched between dielectric layers 15 and 17 is the conductive plane 19, preferably of copper or other well-known conductive material and possessing a thickness preferably within the range of about 0.125 mils to about 2.5 mils. The thicknesses for plane 19 of less than about 0.125 mils may prove undesirable should the resulting structure be subjected to relatively high temperatures. Additionally, thicknesses greater than about 2.5 mils may prove undesirable because of the additional time necessary to form such layers using conventional plating techniques and associated difficulties with line width control.

The resulting structure shown in FIG. 1 thus preferably processes a thickness within the range of about 4.7 mils to about 44 mils. More preferably, a thickness of about 24.8 mils is used.

Prior to applying the conductive layer to the outer surfaces of the dielectric layers, the dielectric surfaces may need to be pretreated to assure sufficient adhesion to the conductive layer to be applied to its surface. Known processes such as seeding with a noble metal, such as palladium, can be employed. Other methods that chemically or physically etch the dielectric substrate surface can also be useful in this invention.

Conductive layers 1 and 3 and dielectric layers 15 and 17 are bonded to the conductive plane 19 using a lamination process. Such a process is well known in the art, so further description is not believed necessary.

Base member 13 thus includes at least two surfaces: a first metallized surface 21, and a second metallized surface 23. Although two conductive layers and two dielectric layers are shown for base member 13, it is understood that the invention is not limited thereto. Specifically, it is necessary to provide only one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending on operational requirements for the finished product.

Figure 2:
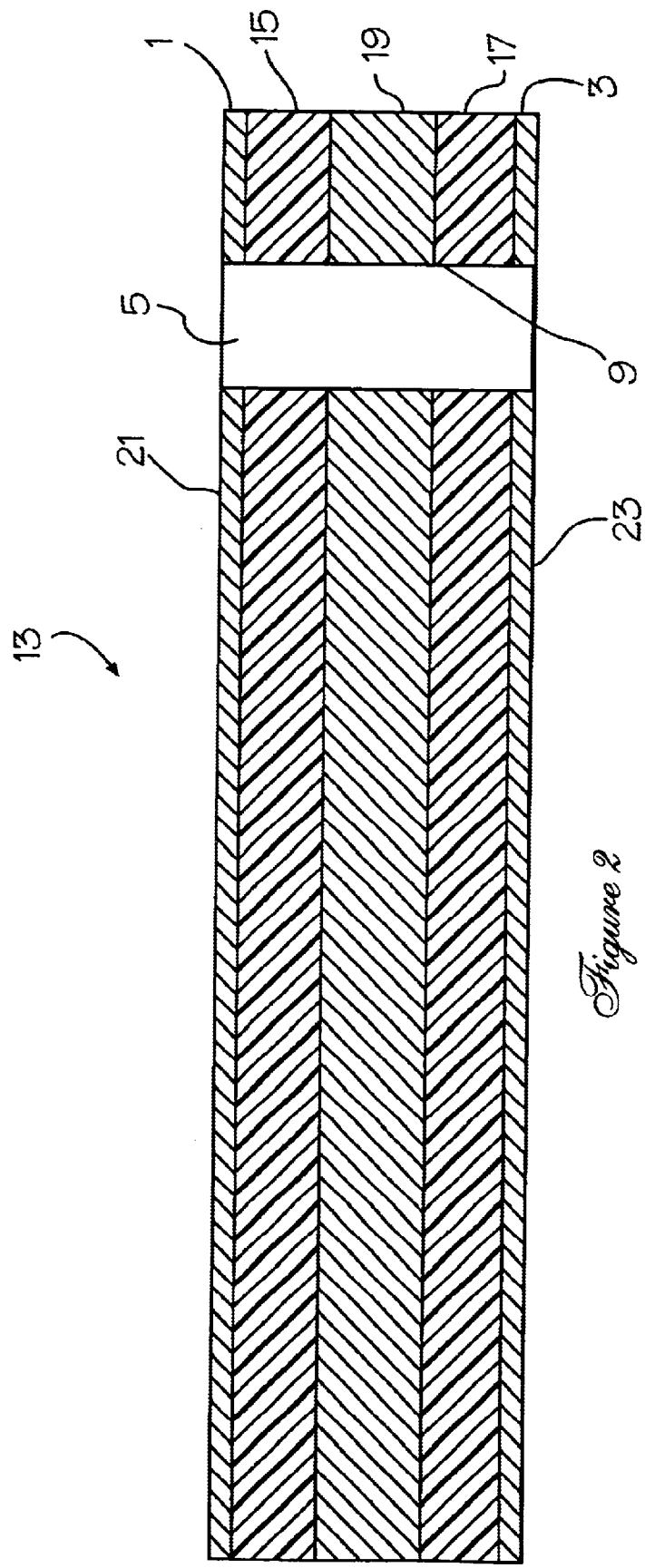
FIG. 2 is an intermediary cross-section view of a printed wiring board as in FIG. 1, further comprising a via.

In FIG. 2, opening 5 having an internal wall 9 is formed substantially through base member 13. Although only one opening 5 formed in base member 13 is shown, it is understood that multiple openings may be formed in base member 13 depending on the ultimate electrical requirements of the circuitized substrate. Opening 5, preferably a hole, may be formed by mechanical drilling, although other hole forming techniques such as punching and laser drilling can be used. Opening 5 is formed with a diameter of about 6 mils to about 14 mils, preferably about 8 mils.

Figure 3:
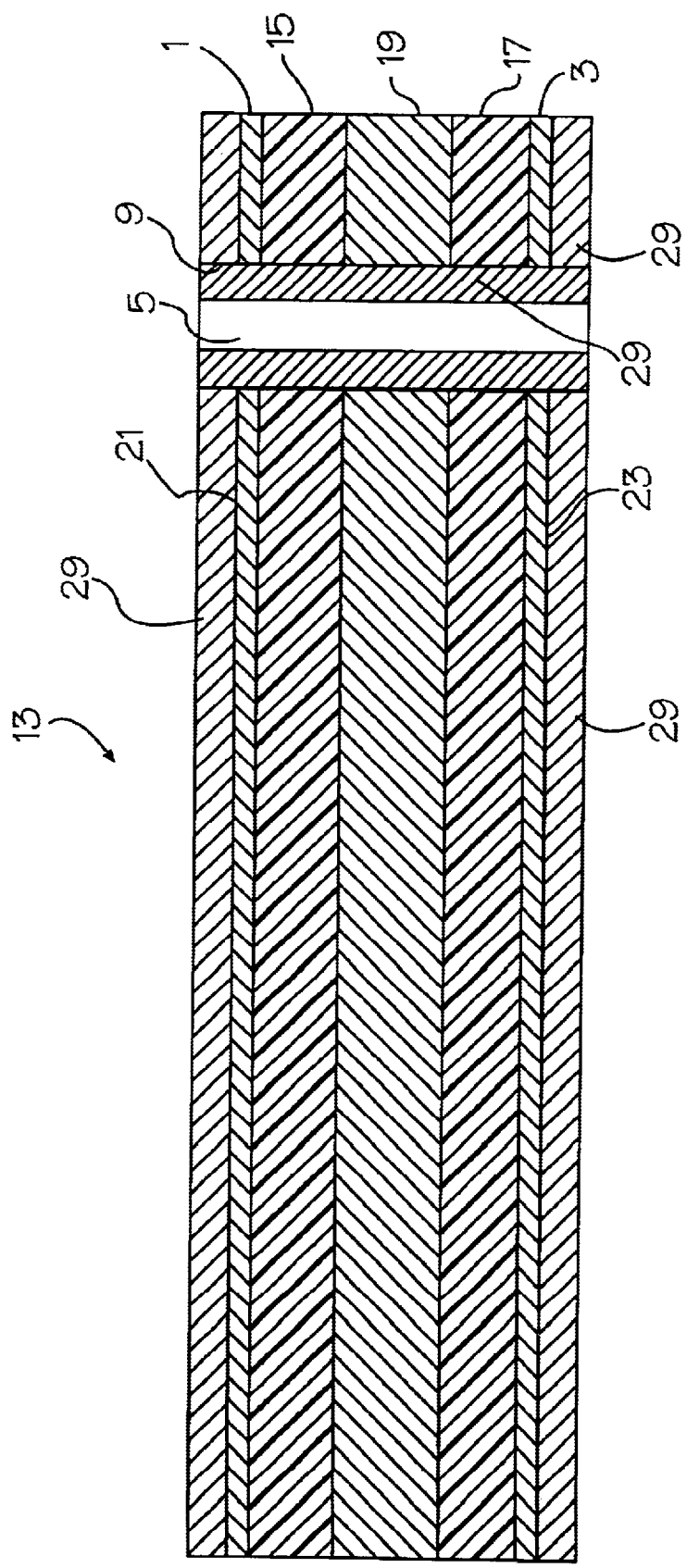
FIG. 3 is an intermediary cross-section view of a printed wiring board as in FIG. 2, wherein the via and both external conductive layers have been overplated with a metal layer.

In the next step (FIG. 3), it is preferred to provide a metallized layer 29 on the surfaces 21 and 23 of base member 13, and on internal wall 9 of opening 5. This conductive layer 29 substantially covers the entire base member 13 and hole 5. The metallized layer 29 may comprise nickel, aluminum, or copper, but is preferably copper. The thickness of this metallized layer may be from about 0.3 mils to about 1.5 mils, preferably about 0.9 mils to about 1.2 mils.

The metallized layer 29 is deposited by conventional plating methods such as electroplating, electroless plating, sputter, mag-ion or other well known techniques. These methods may employ the use of an initial conductive layer (having a thickness of 10 to 60 angstroms), such as a seed layer comprising particles of palladium-tin particles to act as a catalyst for metal deposition. Furthermore, in a method such as electroplating, it is known in the industry that a very thin initial metal deposit (0.01 to 0.2 mils) is made over the catalyst layer to create an electrical commoning layer. Other techniques may implement similar, very thin layers, for deposition. Because of the multiplicity of techniques, the thin layers are not shown.

In one preferred embodiment of this invention, an electroplating process is used for depositing the metallized layer 29.

After application of the metallized layer, the diameter of hole 5 is reduced from about 8 mils to about 6 mils and can be as small as about 2 mils to about 1.2 mils. The metallized layer on hole wall 9 is essentially not the same thickness as layer 29.

In metallizing via holes, there is a plating characteristic known as "throwing power." Briefly, this phenomenon is the ability of the plating process to plate the first conductive layer in a via hole. It is represented as a percent of the thickness of the metallized layer on hole wall 9 divided by the thickness of the metallized layers on the first and second surfaces 29. The industry generally specifies that metallized layer thickness in a via 5 on the hole wall 9 be greater than a minimum thickness at any point along the wall. Most plating processes deliver less than 100% "throw" into the via holes (i.e., more copper is plated on the surface than in the hole wall per unit time).

Conventional processes deposit a greater vertical height to the lateral surfaces than to the via plated thickness. This poses a problem for creating fine line circuitization. As the thickness of the metallized layer increases, it becomes increasing difficult to create circuit traces of a finer pitch. It is therefore desired to keep the first conductive layer as thin as possible on the first and second surfaces. However, there are product reliability concerns with reduced thicknesses of the metallized layer in the plated through holes or vias.

If the surface copper could be thinned down after depositing the appropriate reliable thickness in the through vias, fine pitch circuit creation would be possible.

Since the subsequently described circuitization technique involves etching, there is a need to protect the metallized layer on the internal wall of the opening. This cannot be done in such a small hole using conventional photolithographic techniques. It is therefore necessary to substantially fill the openings with a permanent material to protect the internal wall of the opening. This may be performed using a material which is matched to the coefficient of thermal expansion of the base member and compatible with a previous metal plating bath such as filled epoxy resin based material as described in the aforementioned patent '844 to Bhatt. Two common, basic techniques are available for introducing the fill material into the plated through hole: lamination or screening. Other injection methods are also available. If plated through holes (tooling holes, alignment holes, etc.) are to remain unfilled, a selective method such as that described in Bhatt, U.S. Pat. No. 5,487,218 may be used. However, the hollow region can be filled by any filling method, ideally without wasting too much material. The injection can be made at temperatures above ambient in order to reduce the viscosity of the fill or to actually apply the fill in liquid form that would otherwise be solid at ambient conditions. A useful temperature range between 100° C., and 250° C., is contemplated. A preferred temperature range between 125° C., and 200° C., is recommended.

A useful pressure range is contemplated for injecting the filling material of about 50 psi to about 1000 psi. A preferred pressure range between 100 psi and 600 psi is recommended.

It should be noted that the useful temperature and pressure values for filling the through holes are dependent on one another and are further dependent on the nature of the filling material. Therefore, the ranges presented are meant for illustrative purposes and are not limiting to the invention.

The fill material comprises a dielectric material. This material can be in any physical state or states as long as it can be successfully injected into the through hole and remain there to protect the metallized layer in the through hole during later chemical etching steps. Therefore, it is preferable that the filling material be resistant to chemical etching. The fill material should also have a viscosity and surface tension, among other properties, that allow sufficient flow to fill small, high aspect ratio plated through holes. Specifically, materials such as glasses, resins, and polymers are contemplated, including resins that cure upon aging. These materials can contain varying amounts of gas or liquid so that, for example, the filling material can be essentially a solid with voids of gas bubbles mixed therein. Solid mixtures are also contemplated. For instance, resins with latex particles, silica particles, metal particles or metallic salts are useful for modifying the thermal conductivity or the coefficient of thermal expansion. The fill material should also have good adhesive properties to the metallized wall of the through hole.

In a preferred embodiment, the composition of the filling material is an organic polymeric or resinous material optionally in combination with particulate material which is added to modify the thermal or electrical conductivity and optimize the coefficient of thermal expansion. Useful filling compositions are disclosed in U.S. Pat. No. 5,487,218 and are hereby incorporated by reference.

In one embodiment of the invention, the fill material can be removable after it serves the function of protecting the metallized layer in the through hole from etching. In this embodiment, the filling material must have a melting point below the melting point of the dielectric substrate. After serving its required function, the fill material is removed by heating.

Figure 4:
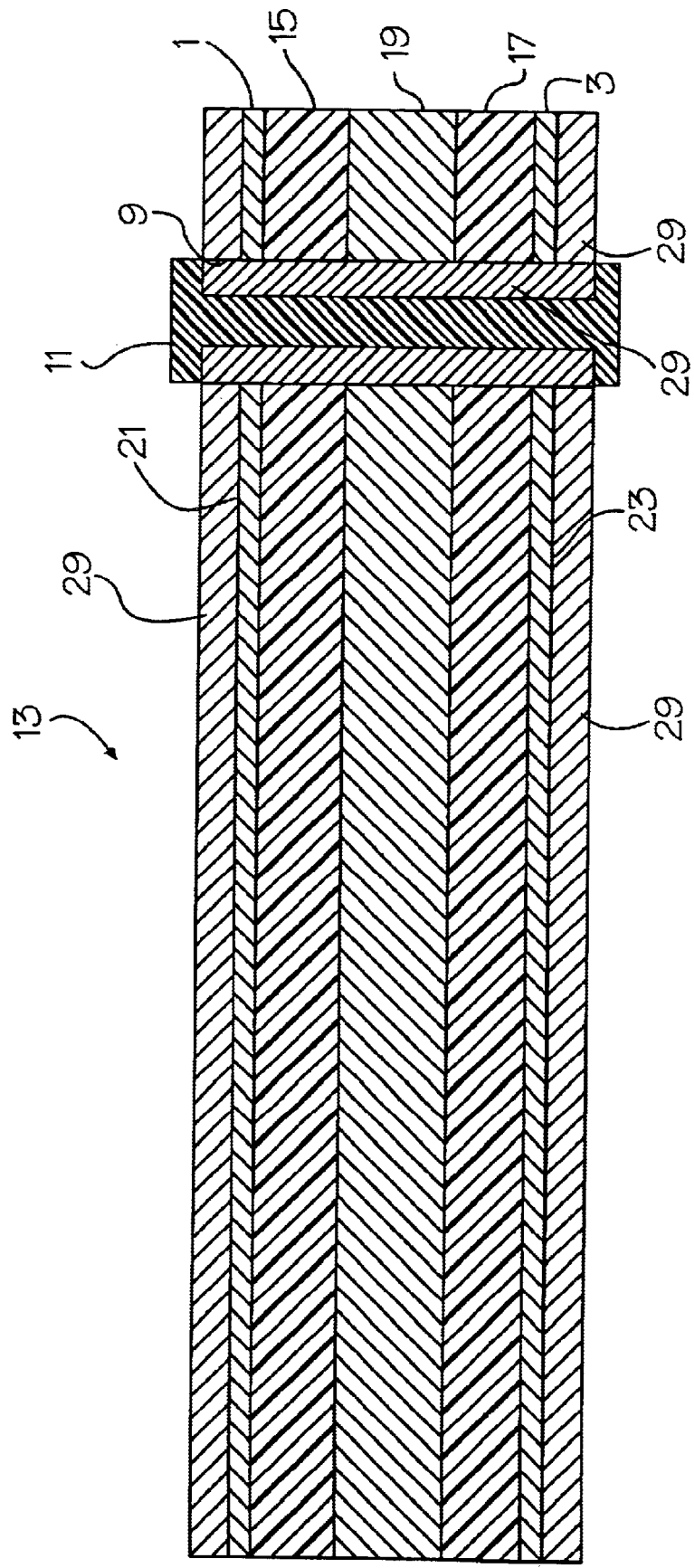
FIG. 4 is an intermediary cross-section view of a printed wiring board as in FIG. 3, wherein the via is filled with essentially non-conductive material, in accordance with the present invention.

FIG. 4 illustrates the resultant structure after substantially filling opening 5 with a permanent material 11. The opening 5 is filled such that the external surfaces of the filled opening are above the metallized layer 29 on the base layer 13, yielding a planar surface for subsequent photolithographic processing described below.

Since the filling process will not always precisely fill the through hole, the upper surfaces of the fill are not always coplanar with the upper surface of the lateral metallize layer surface. Under these circumstances it is highly desirable to remove excess fill by chemical or mechanical means.

Figure 5:
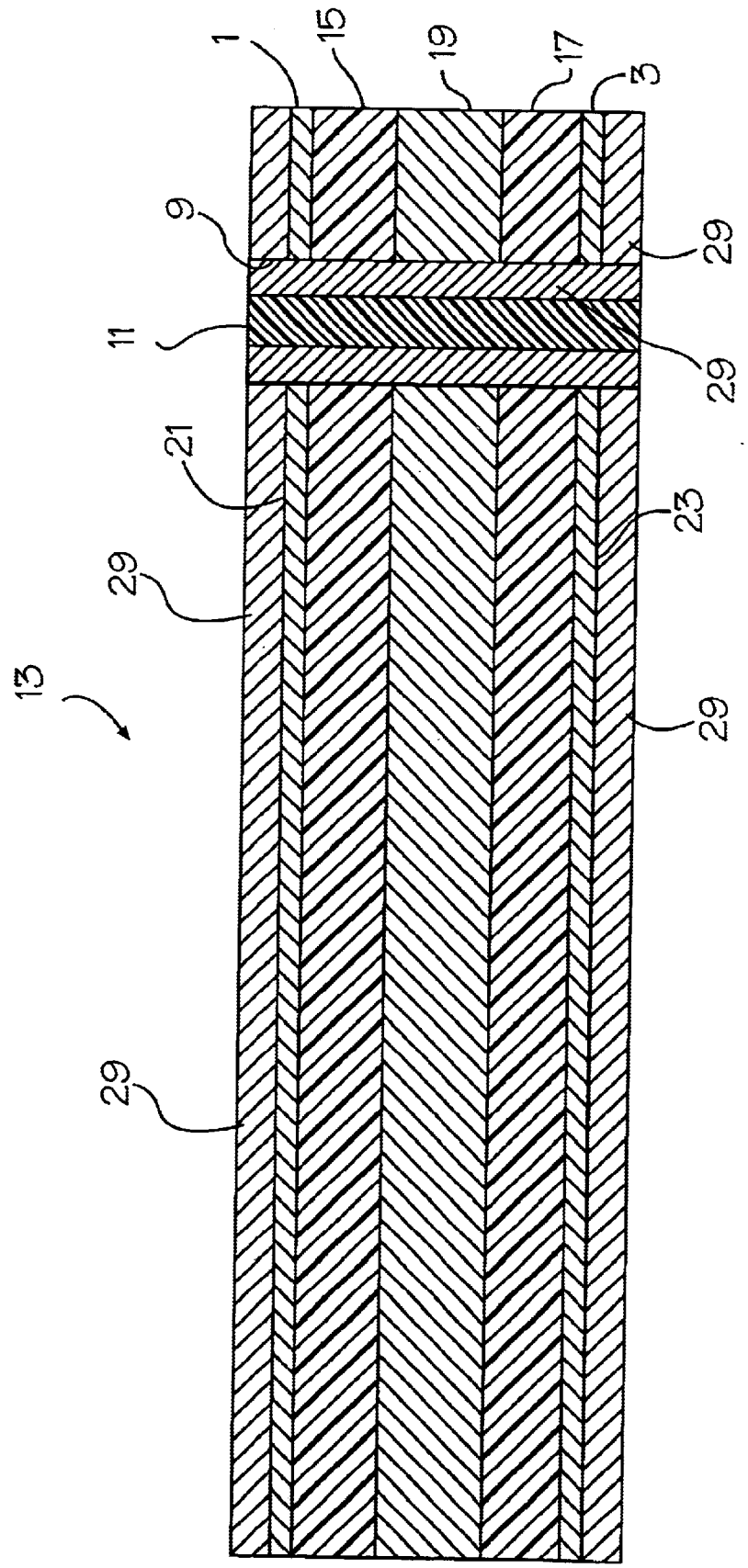
FIG. 5 is an intermediary cross-section view of a printed wiring board as in FIG. 4, wherein the non-conductive filling is planarized with the upper surface of the plated metal layer.

FIG. 5 shows the resultant structure described above after a planarization step, such as mechanical or chemical polishing, yielding a planar surface for subsequent photolithographic processing described below.

Figure 6:
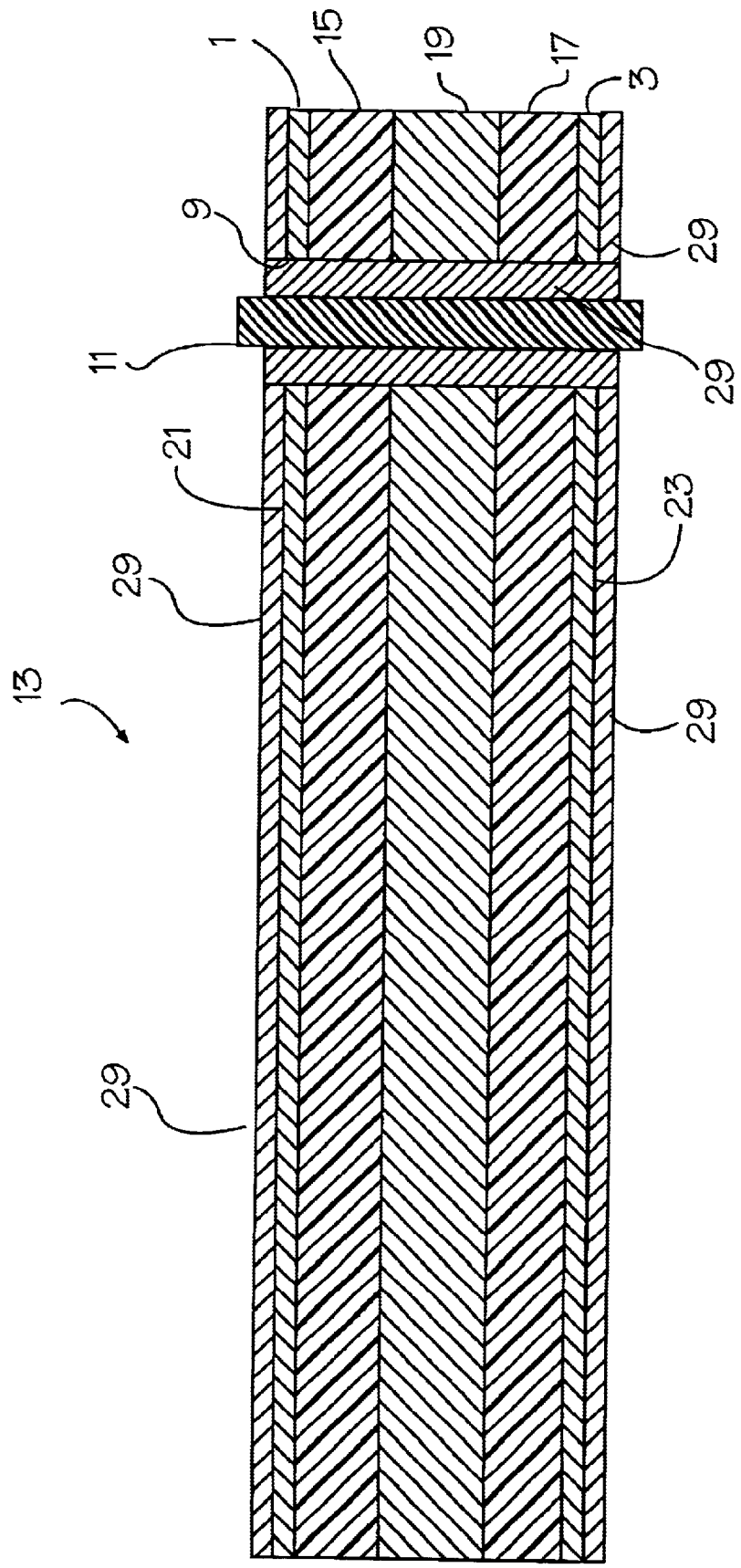
FIG. 6 is an intermediary cross-section view of a printed wiring board as in FIG. 5, wherein the external plated metal layers are uniformly etched.

FIG. 6 illustrates one of the key features of the invention. The first conductive layer 29 is substantially thinned from its previous thickness. In this embodiment, it is reduced down to 0.1 to 0.3 mils. It is possible, through this key step, to eliminate metallized layer 29 through thinning, reducing initial layer 23 and 21. The preferred final thickness of the combined layers of 23 and 29 and also 21 and 29 on the first and second layers is 0.1 to 0.5 mils. The resultant thickness on the first and second surfaces may or may not be the same due to typical random distribution through the standard deviation of any manufacturing process.

Although it is possible to perform the metallized etching step through a multiple pass mechanical grinding operation, the preferred method is a chemical etch. The chemical etch can be any known method that will etch the metal used for the first conductive layer. In this embodiment, a cupric chloride solution is used. Other methods could include cold etching, sodium persulfate, ammoniacal etch, etc. The tool configuration would have to be optimized to provide a uniform thinning down of the first conductive layer. Typically, in the industry, this is performed through conveyor speed or flow nozzle adjustments. Tool settings are not described here since they will vary for the thickness of layer 29 as well as the size of the work panel.

One of the novelties of this invention is that it provides a planar surface to etch. Although the work panel may contain unfilled tooling holes or locating holes, these will be few and should not create uneven etching typically encountered by the use of conveyorized tooling. The process for reducing the thickness of the two conductive layers, whether performed mechanically, chemically or a combination of both, can be performed either sequentially or simultaneously.

FIG. 6 also shows the fill material once again above the plane of the panel surface. Note that the via fill material is not etched during this thinning down process. This is key to the final structure and the thinning process. Otherwise, the internal wall of hole 9 will be etched away and an unreliable structure will be created.

It is also contemplated as part of this invention, to perform a "rework" or other embodiment by the thinning steps, above. It is possible to completely remove layers 21 and 23 as well as layer 29. This method may have usefulness as a rework/recovery process, rather than as an initial fabrication. In typical PWB multilayer board fabrication, the surface metal cannot be etched off entirely, once the through holes or vias have been created. This is because the inner layer connections would be exposed to the etchant chemicals. The amount of etchant required to remove the surface layers would etch back the inner layers to a point at which any subsequent metallization will not make contact, creating electrical opens. With the inventive method, the inner layer connections to the through hole are protected by the non-etchable fill material. If it is desired to recover product due to high yield loss, the conductive layers could be etched off from the first and second surfaces. Several plating operations, as mentioned above, have an optional conditioner step prior to the catalyst application to allow bonding to the substrate surface. In essence, layer 29 could be replated directly onto layers 15 and 17, making electrical contact to the previously plated copper on hole wall 9.

Figure 7:
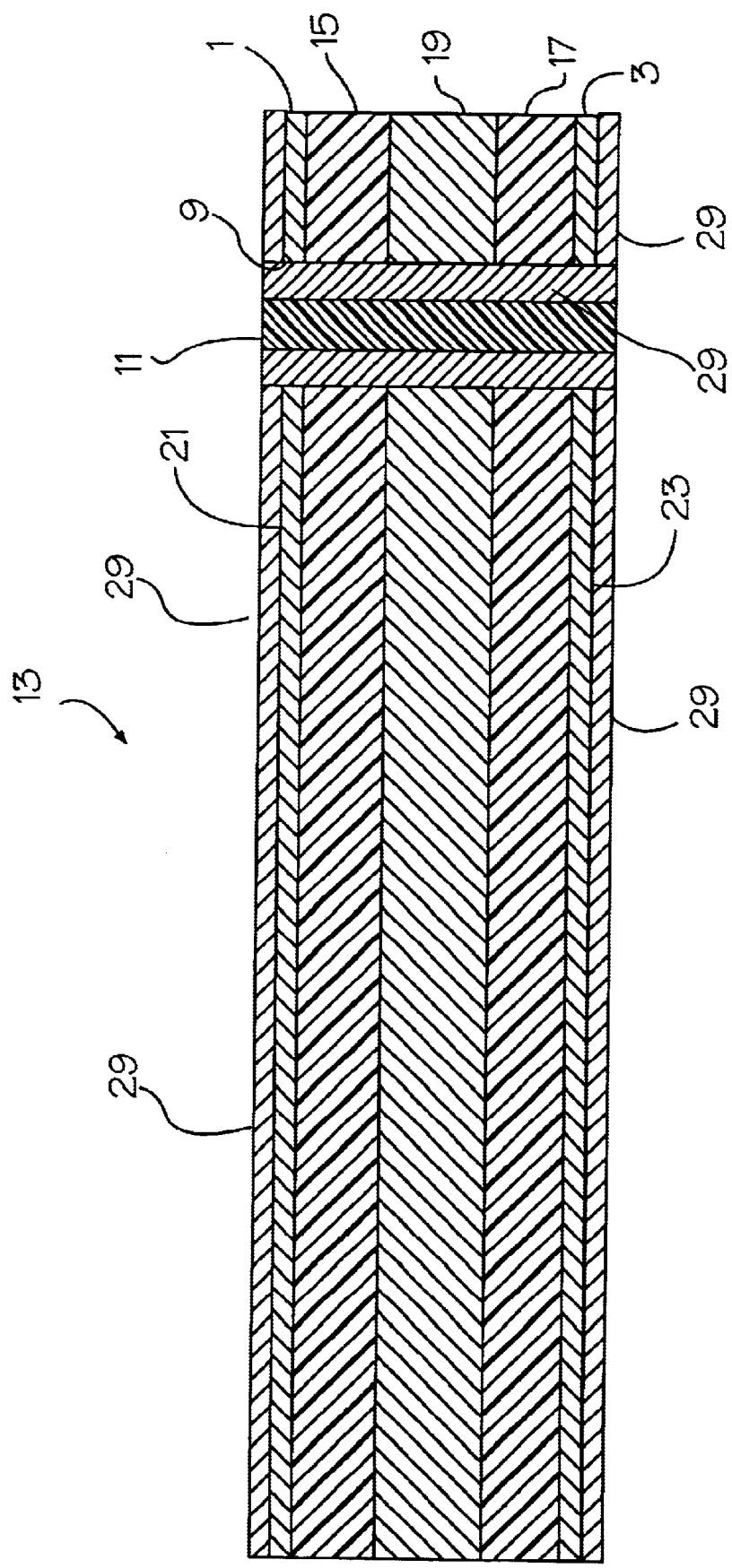
FIG. 7 is an intermediary cross-section view of a printed wiring board as in FIG. 6, wherein the non-conducting material is again planarized to the new level of the upper surface of the respective conductive layers.

In FIG. 7, the resultant structure is shown after another planarization step, removing the unetched excessive fill material above the surface. Note that the hole wall thickness on surface 9 remains plated (from FIG. 3) since it was protected from etching by the fill material.

The reduced thickness uniform metallic plating on the lateral surface of the dielectric substrate is then converted into the necessary features and fine line circuitry found on the finished printed wiring board. Conversion, sometimes known in the industry as personalization, typically is performed by photolithographic means. The process for personalization, in general, employs a series of steps including:

a) applying a photoresist 31 to the metallic layer 29 and fill outer surfaces;

b) applying an opaque mask over the photoresist, the mask having discrete openings in the form of an image that will ultimately be transferred to the metallic layer;

c) exposing the mask to electromagnetic radiation or an electron beam so that such radiation impinges on the photoresist only in areas where openings in the mask are present;

d) removing the mask;

e) applying a chemical etchant to the photoresist to develop a series of openings 35 extending to the underlying metallic layer in areas where the photoresist has high solubility;

f) chemically etching the areas of uncovered metal to uncover dielectric substrate, forming electrically discrete features and circuitry 37; and g) stripping the remaining portion of the photoresist 31 from the upper surface of the latent features and circuitry.

The process must also be performed on the reverse side if the printed wiring board is a two sided article. The personalization steps for the second side can be performed sequentially or simultaneously with those of the first side.

Figure 8:
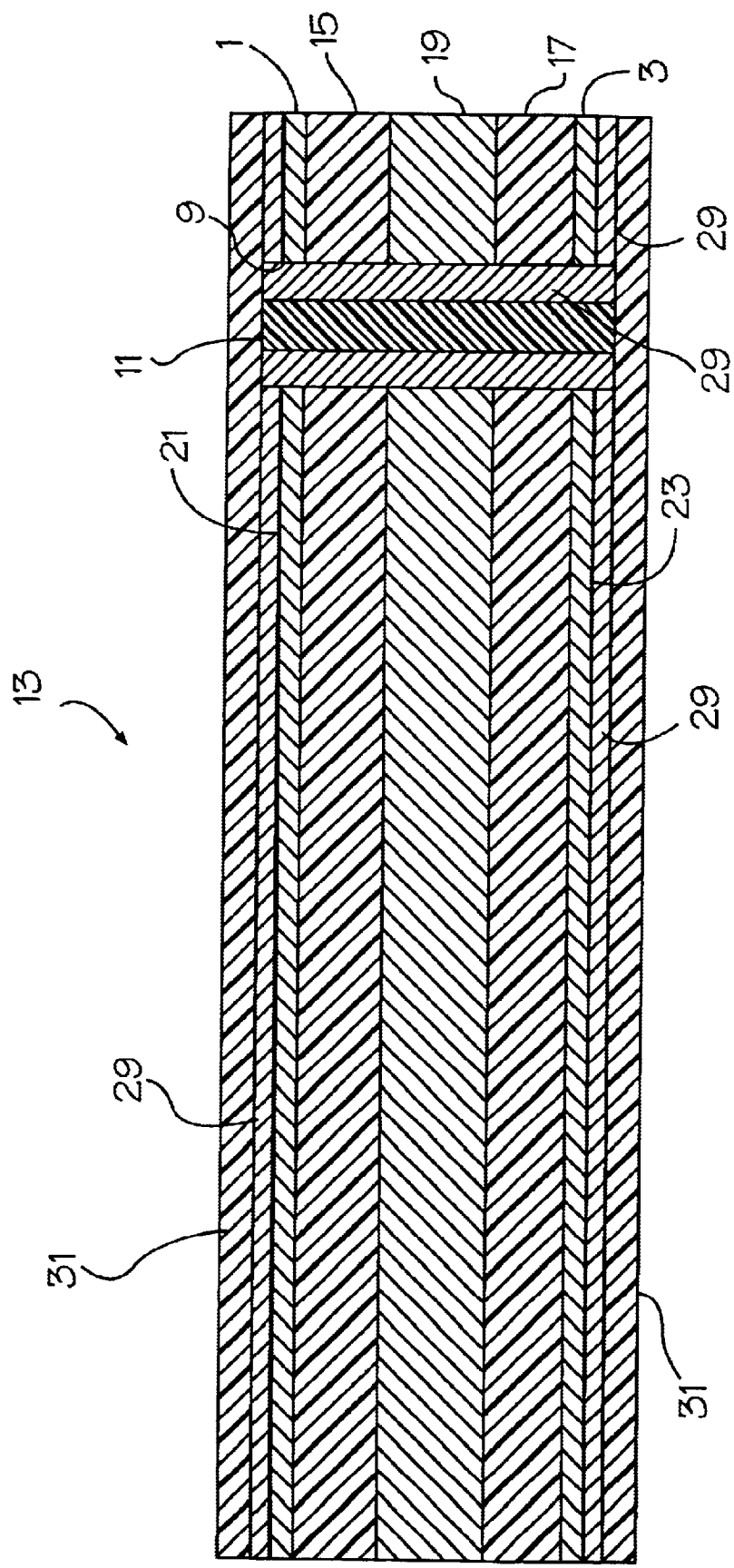
FIG. 8 is an intermediary cross-section view of a printed wiring board as in FIG. 7, wherein a photoresist layer is applied to the upper surface of one of the external metallized layers.

In FIG. 8, layer 31 of photoimaging (photoresist) material is applied on the respective surfaces of member 13. In one example, the layer of photoresist possessed a thickness of from about 0.3 mils to about 2.0 mils. A preferred material is a negative-acting photoresist, various examples being known in the art, including Photoresist 3120 available from the E. I. duPont deNemours Corporation. Negative-acting photoresists, when applied and exposed through a suitable photomask, undergo a physical and chemical change in the exposed areas that render these areas insoluble to the subsequent developing solution applied thereto. Following exposure, the resist-coated base member 13 is immersed in developing solution (e.g., sodium carbonate or propylene carbonate), which allows the unexposed areas to be removed without excessive impact on the hardened, exposed area. Baking or other processes may be used to further harden the remaining, exposed portions, if desired.

In FIG. 9, base member 13 is shown following the above exposure and removal (developing) operations. Only portions of the original photoresist layer 31 remain. These portions are represented by reference numeral 33. It is understood that the removed portions of the photoresist, in turn, result in openings 35 which uncover preselected areas on the respective surfaces on which circuitization is to eventually occur. Thus a predetermined pattern on both surfaces is provided.

Although a negative-acting photoresist procedure has been described, the invention is not limited thereto. It is also possible, instead, to use positive-acting photoresists in which the exposed areas under the photomask are removed, when immersed in the developing solution. It is thus seen that the present invention is adaptable to more than one accepted technology.

Significantly, it can be seen that the plated through hole or via, covered by the photoimaging layer 31, will provide (after removal of the photoresist) a complete and uninterrupted conductive layer around hole 5. The photoimaging material must "tent" the plated through holes. That is, if a liquid, it must coat the entire length of the hole wall. The thinner the photoimaging material is applied, the better the resolution of exposed features. The use of thinner photoimaging materials, whether liquid or solid, to achieve fine line circuitization must still be able to protect portions of the plated vias from being etched. By having a plated via protected from etching, very thin photoimaging layers can be used because there is no concern for achieving a tent or coating the hole walls for a liquid. The process is also robust. In the conventional tenting process, a broken or misregistered tent will allow etching. With this inventive method, unless the photoimaging material is completely missing due to a process error, the conductive path is protected from etching.

The discrete features and circuitry are then formed by the subtractive process. In this process, the imaged photoresist 33 and 35, having discrete areas 33 where the underlying metallic plating layer 29 is uncovered, is subjected to a metal etching process. Since the etchant is effective only where it is in direct contact with the metal surface, etching will occur at the exposed metal only in the areas uncovered. Since the etching process is anisotropic, the etching of the metal will occur both in the horizontal and the vertical directions. The process is optimized to be halted once all the metal within the exposed area is etched. At this point, the circuitry has been individualized and is separated electronically from each other by the dielectric substrate.

In FIG. 10, member 13 has been subjected to an etching process in which copper or similarly conductive metal is removed in the exposed portions (e.g., site 35) following photoresist development.

In a preferred embodiment, the exposed areas are removed by wet etching. Wet etching can be performed by known techniques in the art, preferably with the use of cupric chloride or ferric chloride. Wet etching is well known in the art, so further description is not believed necessary. Wet etching of the exposed areas 35 substantially removes the exposed first electrically conductive layer 29 and conductive layers 1 and 3, leaving exposed portions of the first dielectric layer 15 and the second dielectric layer 17. Non-exposed portions 33 define a circuitized pattern on first dielectric layer 15 and second dielectric layer 17.

In FIG. 11, portions 33 of the photoresist layer 31 are removed, preferably by stripping the photoresist with a suitable solvent known in the art, such as propylene carbonate, sodium carbonate, or sodium hydroxide. Other removal techniques, such as laser ablation and mechanical removal thereof, may also be employed to remove the photoresist layer. In one example, the exposed areas of the first electrically conductive layer on the surfaces of the base member 13 serve as one or more contact pad areas 37. In addition to the exposed contact pad areas, it is also possible to expose one or more areas 39 on a base member 13, depending on operational requirements for the final product. This area 39 is a land segment which in turn surrounds through hole 5 and may serve to interconnect upper and lower layers of circuitry and also internal conductive planes 19, if desired.

It is understood that the number of exposed areas illustrated in FIG. 11 are shown for illustration purposes only and do not limit the invention to those shown. Specifically, in one example of the invention, a total of about 600 pad sites 37 were provided, in addition to about 800 through hole sites 39.

A very similar process flow exists for another preferred embodiment. In this case the electrical connection is between a fine line circuit residing on the surface of the dielectric substrate and another circuit that resides within the dielectric substrate. Electrical connection between the two circuits is achieved with the use of a filled blind hole rather than a filled through hole. The filled blind hole is drilled into the base to a defined depth, this depth being at least that of the embedded circuit. After metallization of the surface, the series of steps in the manufacturing process are as described supra. It is also considered within the scope of the invention that both sides of the substrate can contain circuitry even if the filled blind hole does not electrically connect the two. Other embodiments of the present invention can have combinations of filled blind and filled through holes within a given dielectric substrate. Lastly, other embodiments of the present invention allow for the incorporation of other features attached to the fine line circuitry. These features include but are not limited to, noble metal clad and unclad copper features and resistors comprising nickel or phosphorous/nickel.

Thus there have been shown and described a facile method for producing a circuitized substrate for use as part of a chip carrier assembly which is capable of being readily performed using many established processes of the art. The invention thus represents a relatively inexpensive yet effective process for producing chip carrier structures on a mass scale. While the invention has been described with respect to organic dielectric materials, this is not meant to limit the invention in that even inorganic (e.g., ceramic) may be utilized to provide the dielectric function. As stated above, it is also readily possible to utilize alternative procedures (e.g., additive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What we claim is:

1. A method of manufacturing a printed wiring board structure having high pitch circuitry comprising the steps of:
    a) providing a laminate comprising a dielectric substrate having upper and lower lateral surfaces and at least one through hole extending from said upper lateral surface to said lower lateral surface, said through hole having a wall within said dielectric substrate, and a contiguous metal coating covering said upper and lower lateral surfaces and said wall of said through hole, said contiguous metal coating having an outer metal surface and a first height thickness on said upper and lower lateral surfaces and a first wall thickness on said through hole;
    b) completely filling said metal coated through hole with a dielectric resin in order to form a solid plug having a surface in contact with said outer metal surface within said through hole;
    c) creating first fine line metallized circuitry from said metal coating disposed upon said dielectric substrate upper lateral surface, said first fine line circuitry having a second height thickness; and
    d) creating second fine line metallized circuitry from said metal coating on said dielectric substrate lower surface, said second fine line circuitry having a third height thickness, said first and second fine line circuitry being electrically connected through said metal coated through hole and said second and third height thicknesses, both of which are smaller in thickness than said first height thickness.

2. The method of manufacturing a printed wiring board structure having high pitch circuitry as recited in claim 1 wherein said wall and said plug are essentially cylindrical.

3. The method of manufacturing a printed wiring board structure having high pitch circuitry as recited in claim 1 wherein said plug has a topmost surface in contact with said metal coating of said outer surface of said upper lateral surface and has a bottommost surface in contact with said metal coating of said outer surface of said lower lateral surface, a distance between said topmost surface and said bottommost surface defining a length of said plug.

4. The method of manufacturing a printed wiring board structure having high pitch circuitry as recited in claim 3 further comprising the steps of:
    e) removing portions of said topmost surface of said plug, and said metal coating outer surface on said upper lateral surface of said dielectric substrate in order to decrease said length of said plug, reduce said first height thickness, and to make said topmost surface of said plug essentially coplanar with said metal coating of said outer surface of said dielectric substrate upper lateral surface; and
    f) removing portions of said bottommost surface of said plug and said metal coating of said outer surface of said lower lateral surface of said dielectric substrate, in order to decrease said length of said plug, reduce said first height thickness and to make said bottommost surface of said plug essentially coplanar with said metal coating of said outer surface of said lower lateral surface of said dielectric substrate, and wherein steps (e) and (f) are performed sequentially or simultaneously between said steps (b) and (c).

5. The method of manufacturing a printed wiring board structure having high pitch circuitry as recited in claim 4 wherein said step (e); removing topmost surface portions of said plug and said metallic outer surface, further includes:
    g) planarizing said topmost surface of said plug;
    h) mechanically or chemically abrading both said topmost surface of said plug, and said outer surface of said metallic coated upper lateral surface of said dielectric substrate; and
    i) replanarizing both said topmost surface of said plug and said upper lateral surface of said dielectric substrate; wherein said steps (g) through (i) can be sequential or simultaneous.

6. The method of manufacturing a printed wiring board structure having high pitch circuitry as recited in claim 1 wherein steps (c) and (d) are performed simultaneously.

7. The method of manufacturing a printed wiring board structure having high pitch circuitry as recited in claim 1 wherein said second and third height thicknesses are essentially equal.

8. The method of manufacturing a printed wiring board structure having high pitch circuitry as recited in claim 1 wherein said filling of said metal coated through hole comprises the further step (e) of applying at least one mask having holes extending to at least one metal coating of said outer surface of said lateral surfaces of said dielectric substrate, said mask positioned to have said holes above metal coated through holes, and further comprising the step (f) of injecting, under pressure, a resinous dielectric material.

9. The method of manufacturing a printed wiring board structure having high pitch circuitry as recited in claim 1 wherein creating fine line circuitry of step (c) comprises the further lithographic steps of:

e) applying a photoresist to said metallic outer surfaces and said topmost surface of said plug;

f) covering said photoresist with a photomask to allow image exposure;

g) exposing said photoresist in areas uncovered by said photomask to irradiation;

h) removing said photomask;

i) developing said exposed photoresist to uncover said metallic outer surfaces;

j) etching said metallic outer surfaces; and k) stripping excessive photoresist from outer surfaces.

10. A method of manufacturing a printed wiring board structure having high pitch circuitry comprising the steps of:

a) providing a laminate comprising a dielectric substrate having upper and lower lateral surfaces, an inner circuit with said dielectric substrate and at least one blind hole having a wall extending from said upper lateral surface to a depth within said dielectric substrate such that said wall of said blind hole contacts said inner circuit, and a contiguous metal coating covering said upper lateral surface and said wall of said blind hole, said contiguous metal coating having an outer surface and a first height thickness disposed on said upper lateral surface and a first wall thickness disposed on said wall of said blind hole;

b) completely filling said metal coated blind hole with a dielectric resin in order to form a solid plug having an upper surface in contact with said metal coating; and c) creating first fine line metallized circuitry from said metal coating disposed on said dielectric substrate, said first fine line circuitry having a second height thickness; wherein said first fine line circuitry is electrically connected to said inner circuit through said metal coated blind hole and, further wherein said second height thickness is smaller than said first height thickness.

11. The method of manufacturing a printed wiring board having high pitch circuitry as recited in claim 10 wherein:

said wall of said blind hole is cylindrical in shape; and
   said wall of said plug is substantially cylindrical in shape.

12. The method of manufacturing a printed wiring board structure having high pitch circuitry as recited in claim 10 wherein:

said plug has a topmost surface in contact with said metal coating disposed on said upper lateral surface of said dielectric substrate.

13. The method of manufacturing a printed wiring board structure having high pitch circuitry as recited in claim 10 further comprising the step of:

d) removing portions of a topmost surface of said plug and said metal coating on said upper lateral surface of said dielectric substrate in order to decrease plug length, reduce said topmost surface, and make it coplanar with said metal coating disposed on said upper lateral surface of said dielectric substrate.

\* \* \* \* \*